US007480142B2

(12) United States Patent
Carney

(10) Patent No.: US 7,480,142 B2
(45) Date of Patent: Jan. 20, 2009

(54) BOOST SPRING HOLDER FOR SECURING A POWER DEVICE TO A HEATSINK

(75) Inventor: Allen Carney, Vadnais Heights, MN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 24 days.

(21) Appl. No.: 11/637,538

(22) Filed: Dec. 12, 2006

(65) Prior Publication Data
US 2008/0137302 A1 Jun. 12, 2008

(51) Int. Cl.
*H05K 7/20* (2006.01)
(52) U.S. Cl. ............. 361/699; 361/689; 361/698; 361/704; 174/15.1; 165/80.3; 165/80.4
(58) Field of Classification Search ............... None
See application file for complete search history.

(56) References Cited

U.S. PATENT DOCUMENTS

| 4,226,281 | A | * | 10/1980 | Chu | 165/80.2 |
|---|---|---|---|---|---|
| 4,448,240 | A | * | 5/1984 | Sharon | 165/80.4 |
| 4,563,725 | A | * | 1/1986 | Kirby | 361/708 |
| 4,753,287 | A | * | 6/1988 | Horne | 165/80.3 |
| 4,835,405 | A | | 5/1989 | Clancey et al. | |
| 5,133,403 | A | * | 7/1992 | Yokono et al. | 165/185 |
| 5,283,467 | A | * | 2/1994 | Goeschel et al. | 257/718 |
| 5,296,739 | A | * | 3/1994 | Heilbronner et al. | 257/687 |
| 5,305,185 | A | | 4/1994 | Samarov et al. | |
| 5,329,419 | A | * | 7/1994 | Umezawa | 361/699 |
| 5,433,175 | A | | 7/1995 | Hughes et al. | |
| 5,591,034 | A | | 1/1997 | Ameen et al. | |
| 5,592,021 | A | | 1/1997 | Meschter et al. | |
| 5,640,304 | A | * | 6/1997 | Hellinga et al. | 361/707 |
| 5,784,267 | A | | 7/1998 | Koenig et al. | |
| 6,088,226 | A | | 7/2000 | Rearick | |
| 6,144,092 | A | | 11/2000 | Kappes et al. | |
| 6,483,708 | B2 | | 11/2002 | Ali et al. | |
| 6,538,889 | B1 | | 3/2003 | Barsun et al. | |
| 6,545,870 | B1 | | 4/2003 | Franke et al. | |
| 6,549,410 | B1 | | 4/2003 | Cohen | |
| 6,654,250 | B1 | | 11/2003 | Alcoe | |
| 6,765,157 | B2 | | 7/2004 | Rademacher et al. | |
| 6,782,941 | B2 | | 8/2004 | Lee | |
| 6,801,019 | B2 | | 10/2004 | Haydock et al. | |
| 6,867,976 | B2 | * | 3/2005 | Belady et al. | 361/704 |
| 6,965,818 | B2 | | 11/2005 | Koenig et al. | |
| 6,999,317 | B2 | * | 2/2006 | Chengalva et al. | 361/715 |
| 2002/0044422 | A1 | | 4/2002 | Bailey et al. | |
| 2004/0040694 | A1 | | 3/2004 | Hazelton | |
| 2004/0057212 | A1 | | 3/2004 | Russell et al. | |
| 2006/0068611 | A1 | | 3/2006 | Weaver, Jr. et al. | |

* cited by examiner

*Primary Examiner*—Boris L Chervinsky
(74) *Attorney, Agent, or Firm*—Krieg DeVault LLP; J. Bruce Schelkopf; L. Scott Paynter

(57) ABSTRACT

A system and method of dissipating heat form electronic components in an electronic device is disclosed. The apparatus includes a retaining device having a cavity extending upwardly a predetermined distance from a lower surface of the casing. A spring is seated within the cavity such that a lower portion of the spring protrudes outwardly a predetermined distance from the lower surface of the casing. A heatsink is positioned below a heat generating component such that the spring of the retaining device forces the heat generating component against the heatsink.

20 Claims, 5 Drawing Sheets

BOOST SPRING HOLDER FOR SECURING A POWER DEVICE TO A HEATSINK

BACKGROUND

The present invention relates to electrical systems, and more particularly, but not exclusively, relates to systems and methods for dissipating heat from heat generating electronic devices.

Many power-dissipating devices have packages of a standard style and shape. The packages of these power-dissipating devices are typically thermally-active and can often reach extremely hot operating temperatures. Several of these types of devices may be utilized in any given system. Often, it is desirable to utilize as little space as possible in order to miniaturize the overall size of the system utilizing these devices. More power in less space frequently translates to increased power densities, and higher device operating temperatures which can lead to a desire to incorporate dedicated heat dissipation devices. Maintaining good thermal contact between the heat generating component and dissipation device can be challenging and available schemes for providing such contact have shortcomings. Thus, there is an ongoing demand for further contributions in this area of technology.

SUMMARY

One embodiment of the present invention includes a unique technique involving heat dissipation in electronic devices. Other embodiments include unique methods, systems, devices, and apparatus involving the dissipation of heat from electronic devices. Further embodiments, forms, features, aspects, benefits, and advantages of the present application shall become apparent from the description and figures provided herewith.

DETAILED DESCRIPTION OF REPRESENTATIVE EMBODIMENTS

Figure 1:
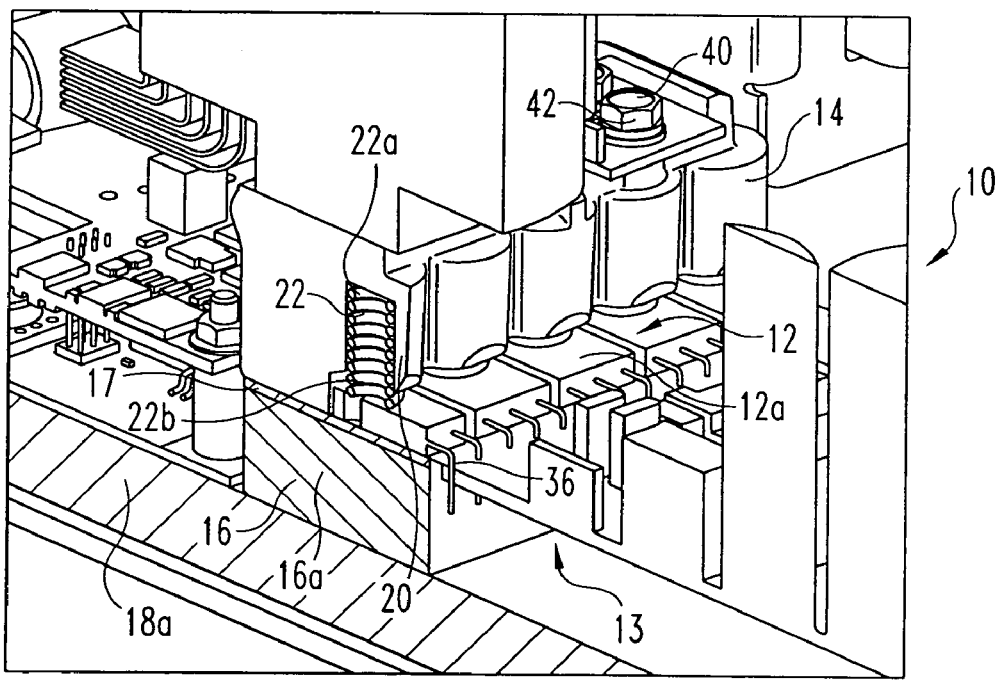
FIG. 1 is a cross-sectional perspective view of a power electronics circuitry and heat dissipation assembly.
Figure 2:
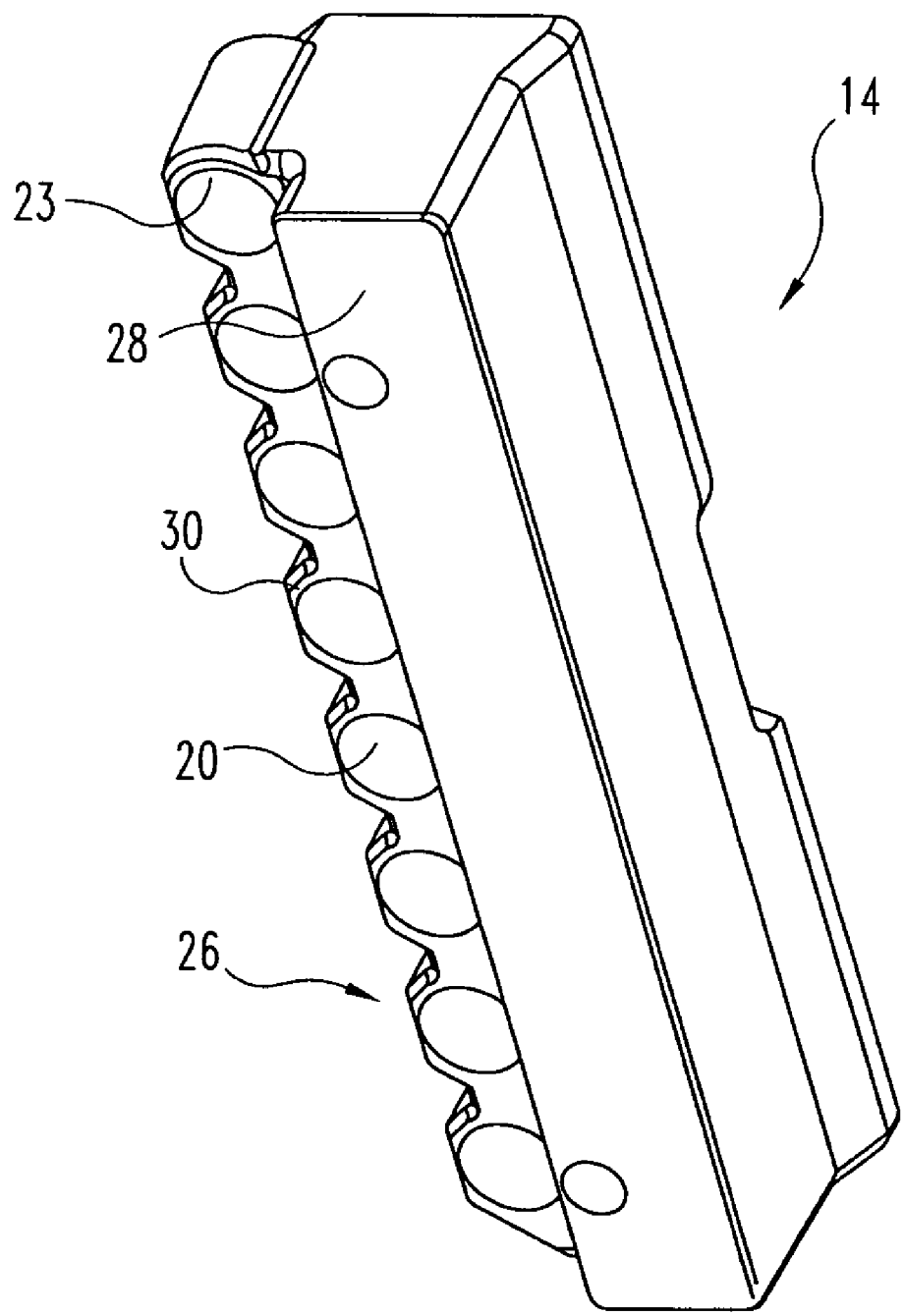
FIG. 2 is a perspective view of a lower surface of a thermally-conductive casing.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, a partial, cross-sectional perspective view of a power electronics circuitry and heat dissipation assembly 10 is illustrated that is operable to dissipate heat generated by components 12 of electronic circuitry 13. As depicted, components 12 include a number of semiconductor components 12a that may be any of many types of components commonly used in the electronic equipment that generate heat such as, bipolar transistors or another active switch type (e.g.—field effect transistors ("FETS")), semiconductor relays (SCRs), thyristors, integrated circuits, diodes, and so forth. For the purpose of the present invention, it should be appreciated that the heat generating electronic components 12 may operate at high temperatures and may comprise one of many different types of devices. In many applications, dissipation of access heat from components 12 may be desired, and in some cases, active cooling may be provided with a heat exchange device utilizing a coolant fluid.

The heat dissipation assembly 10 further includes a thermally-conductive retaining device 14 and a heatsink 16. The thermally-conductive retaining device 14 is positioned on a portion of the upper surface of the heatsink 16, having a thermally conductive, electrical insulating adhesive layer 17 positioned therebetween. Heatsink 16 includes a thermally conductive block 16a, in thermal contact with the upper surface of a cold plate 18, which will be discussed in further detail below. The thermally-conductive retaining device 14 defines a number of cavities that each retains a respective coil spring 22. These coil springs 22 are shown in a compressed state in FIG. 1. When assembled, each spring 22 is operable to apply a compressive clamping force to the upper surface of a respective heat generating electronic component 12. This compressive force causes the lower surface of the heat generating electronic component 12 to maintain thermal contact with the upper surface of the heatsink 16.

Referring to FIGS. 2-5, a perspective view of an illustrative retaining device 14 is illustrated. The retaining device 14 is illustrated as having an elongated generally rectangular shape or configuration, however, other shapes and configurations are envisioned. The retaining device 14 includes an upper surface 24 and a lower surface 26. The lower surface 26 may define a base contact portion 28 and an offset portion 30, which is offset by a predefined distance (an "offset distance") relative to the generally planar contact surface 28a of base portion 28. Based portion 28 defines a foot 29 that is thermally coupled to block 16a, as will be further described hereinafter.

The offset distance may be somewhat greater than the vertical height of the heat generating electronic components 12. The offset base portion 30 includes a plurality of cavities 20 that each hold a respective one of the springs 22. The cavities 20 extend up into the base portion 28 a predefined distance and end with a terminating engagement seat 23 having a profile with a diameter approximately equal to the diameter of spring 22. Compared to the engagement seat 23, the remainder of the cavity 20 has a relatively larger profile to permit free insertion of spring 22. Spring 22 has end portion 22a opposite end portion 22b. To assemble spring 22 with retaining device 14, end portion 22a is advanced through cavity 20 until it reaches the engagement seat 23, sufficient force is applied to provide a press-fit, frictional engagement with the wall of retaining device 14 that defines the size and shape of engagement seat 23 for such press-fit coupling.

Figure 3:
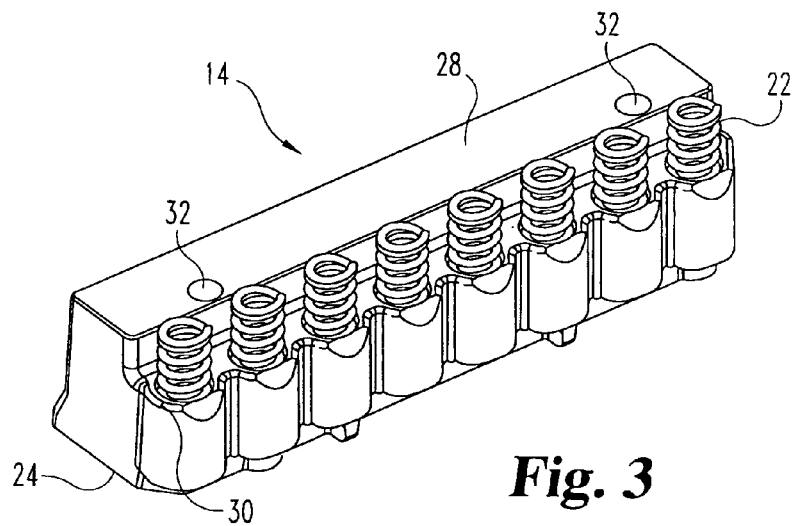
FIG. 3 is another perspective view of a lower surface of a thermally-conductive retaining device depicting springs of the thermally-conductive casing.
Figure 4:
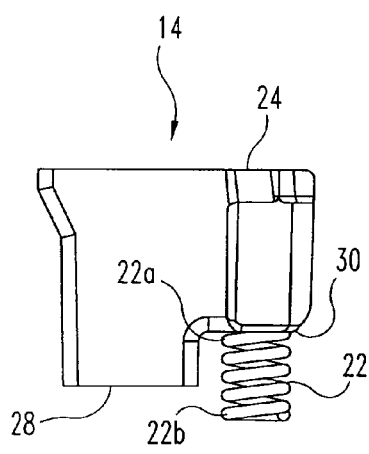
FIG. 4 is a side view of the thermally-conductive retaining device illustrated in FIG. 3.

Referring collectively to FIGS. 3 and 4, the position of the springs 22 in relation to the base portion 28 of the lower surface 26 is illustrated. The springs 22 protrude past surface 28a when in a relaxed, uncompressed state. This arrangement typically facilitate application of a greater compressive force on components 12 with springs 22 when assembled together. As illustrated in FIG. 3, the retaining device 14 may also include at least one aperture 32 that runs through the entire width of the retaining device 14. As discussed in more detail below, these apertures 32 allow the retaining device 14 to be firmly connected in a fixed relationship relative to the heatsink 16.

Figure 5:
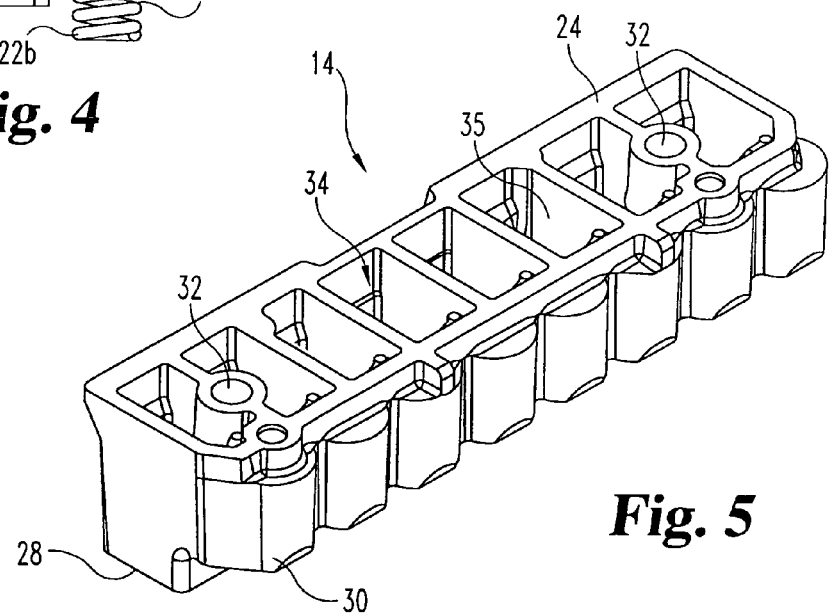
FIG. 5 is a perspective view of an upper surface of the thermally-conductive casing.

Referring to FIG. 5, the upper surface 24 of the retaining device 14 may define a honey-comb configuration 34. The honey-comb configuration 34 may be formed by including a plurality of hollowing cavities 35 in the retaining device 14. It should be appreciated that the springs 22 and/or retaining device 14 can be made of a material with high thermal conductivity and otherwise structured to augment heat dissipation provided by heatsink 16; however, in other embodiments, this configuration may not be present. In one arrangement, each spring 22 is made of a steel music wire finished with zinc and clear chromate, and retaining device 14 is die cast from aluminum ANSI 380, and finished by light machining. Nonetheless, other compositions and manufacturing approaches are contemplated. When assembled, because the springs 22 make contact with the heat generating electronic components 12, heat is transferred from the heat generating electronic components 12 to the springs 22. For the depicted arrangement, it is envisioned that the primary path of thermal conduction is through the heat sink 16 to cold plate 18. Nonetheless, it should be appreciated that some degree of dissipation could occur through the springs 22 and the retaining device 14. Indeed, in an alternative embodiment, the spring/retainer pathway may be the primary way heat from components 12 is dissipated.

Figure 6:
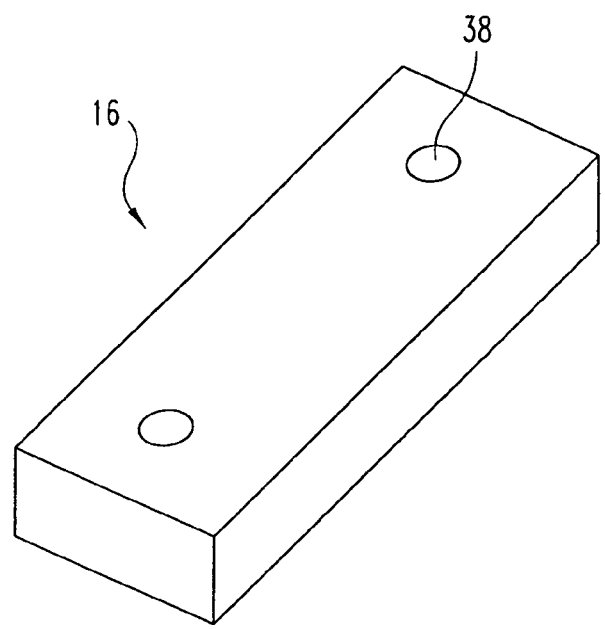
FIG. 6 is a perspective view of a heatsink.

As illustrated in FIG. 1, the foot 29 of the retaining device 14 is positioned on top of the upper surface of the heatsink 16. In some embodiments, a thermally-conductive and electrically-insulating layer of material 36 may be positioned between the retaining device 14 and the heatsink 16. This layer of material 36 may provide insulation to ensure that electric current does not pass from the heat generating electronic components 12 to the heatsink 16. As illustrated in FIG. 6, the heatsink 16 has a rectangular shape or configuration, although it should be appreciated that other shapes and configurations are envisioned. The heatsink 16 may be made from a thermally-conductive material such as, for example, aluminum 6063-T5. The heatsink 16 includes apertures 38 that extend through the heatsink 16. The apertures 38 of the heatsink 16 are aligned with the apertures 32 of the retaining device 14.

Referring back to FIG. 1, the retaining device 14 is connected with the heatsink 16 using a stud 40. The stud 40 protrudes upwardly from the cold plate 18 a predetermined distance. The stud 40 extends through the apertures 32 and 38 of the retaining device 14 and the heatsink block 16a. A nut 42 is used to securely fasten the retaining device 14 to the heatsink block 16a and in turn, to the cold plate 18. Other ways of connecting the retaining device 14 to the heatsink 16 are envisioned. It should be appreciated that a thermal coupling grease, such a silicon grease can be used between block 16a and cold plate 18 to enhance thermal conductivity therebetween.

Figure 7:
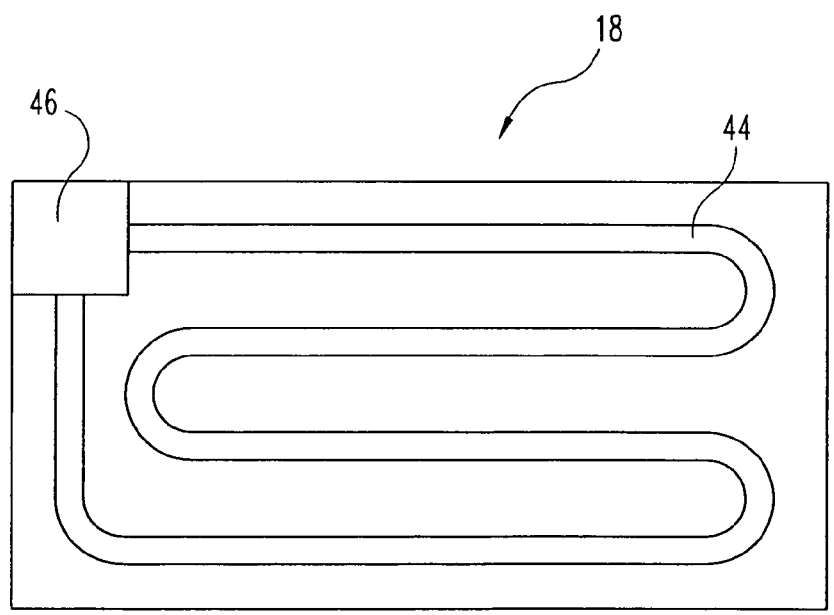
FIG. 7 is a top view of a cold plate and a fluid circulation device.

Referring to FIG. 7, a top view of the cold plate 18 is set forth. In some embodiments, the cold plate 18 includes a tubing material 44 that is interwoven in an upper surface of the cold plate 18 or alternatively within the interior of the cold plate 18. The tubing material 44 is connected with a coolant fluid circulation device 46 schematically shown in a location remote to the plate 16b. The fluid circulation device 46 is operable to circulate cooling fluid through the tubing material 44. This circulating fluid operates to cool the heatsink 16. It should be appreciated that while heatsink 16 includes both a block 16a and plate 18 with "active" cooling by fluid circulation, in other embodiments, the block and/or plate may be absent. Also, alternatively or additionally, other heatsink configurations can be used to dissipate heat from one or more components 12 in conjunction with the clamp 50 provided by virtue of retaining device 14 and springs 22 held in fixed relation to the heatsink.

Figure 8:
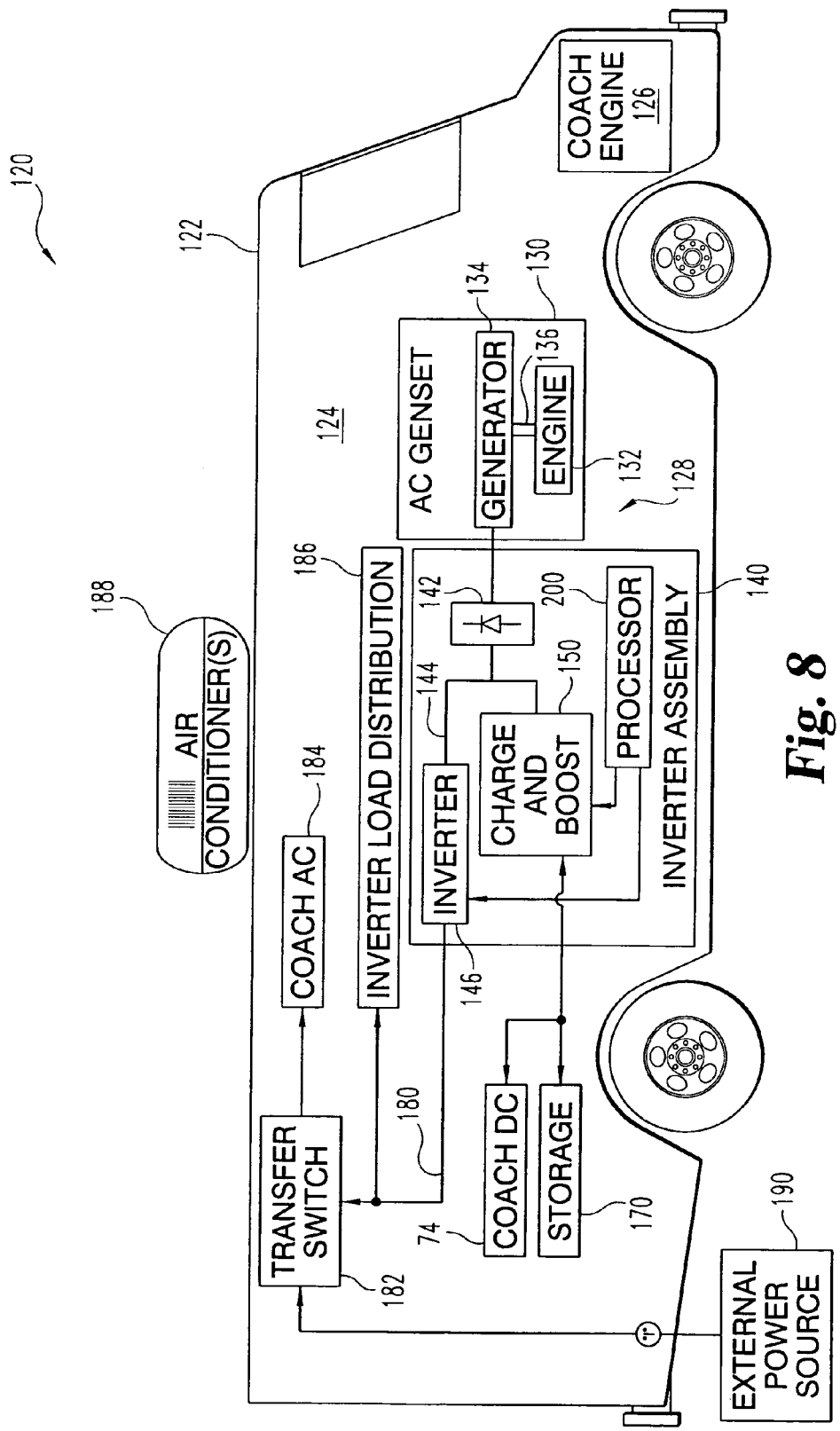
FIG. 8 is a diagrammatic view of a vehicle system incorporating the power electronics and heat dissipation assembly of FIGS. 1-7.

In one application, assembly 10 is utilized in a vehicle power generation system application as illustrated in FIG. 8. FIG. 8 depicts vehicle 120 in the form of a motor coach 122. Motor coach 122 includes interior living space 124 and is propelled by coach engine 126. Coach engine 126 is typically of a reciprocating piston, internal combustion type. To complement living space 124, coach 126 carries various types of electrical equipment 127, such as one or more air conditioner(s) 88. Equipment 127 may further include lighting, kitchen appliances, entertainment devices, and/or such different devices as would occur to those skilled in the art. Coach 122 carries mobile electric power generation system 128 to selectively provide electricity to equipment 127. Correspondingly, equipment 127 electrically loads system 128. In one form, various components of system 128 are distributed throughout vehicle 120—being installed in various bays and/or other dedicated spaces.

System 128 includes two primary sources of power: Alternating Current (AC) power from genset 130 and Direct Current (DC) power from electrical energy storage device 70. Genset 130 includes a dedicated engine 132 and three-phase AC generator 134. Engine 132 provides rotational mechanical power to generator 134 with rotary drive member 136. In one arrangement, engine 132 is of a reciprocating piston type that directly drives generator 134, and generator 134 is of a permanent magnet alternator (PMA) type mounted to member 136, with member 136 being in the form of a drive shaft of engine 132. In other forms, generator 134 can be mechanically coupled to engine 132 by a mechanical linkage that provides a desired turn ratio, a torque converter, a transmission, and/or a different form of rotary linking mechanism as would occur to those skilled in the art. Operation of engine 132 is regulated via an Engine Control Module (ECM) (not shown) that is in turn responsive to control signals from control and inverter assembly 140 of system 128.

The rotational operating speed of engine 132, and correspondingly rotational speed of generator 134 varies over a selected operating range in response to changes in electrical loading of system 128. Over this range, genset rotational speed increases to meet larger power demands concomitant with an increasing electrical load on system 128. Genset 130 has a steady state minimum speed at the lower extreme of this speed range corresponding to low power output and a steady state maximum speed at the upper extreme of this speed range corresponding to high power output. As the speed of genset 130 varies, its three-phase electrical output varies in terms of AC frequency and voltage.

Genset 130 is electrically coupled to assembly 140. It is in assembly 140 that assembly 10 finds application; however, it should be appreciated that assembly 10 could alternatively or additionally be used with other power electronics devices of system 128, vehicle 120, and/or in other applications besides vehicle 120 or any of its systems. Also, it should be appreciated that assembly 140 utilizes cold plate 18 to dissipate heat for a number of its components besides those shown in connection with assembly 10.

Assembly 140 includes power control circuitry 140a to manage the electrical power generated and stored with system 128. Circuitry 140a includes three-phase rectifier 142, variable voltage DC power bus 144, DC-to-AC power inverter 146, charge and boost circuitry 150, and processor 200. Assembly 140 is coupled to storage device 170 to selectively charge it in certain operating modes and supply electrical energy from it in other operating modes via circuitry 150 as further described hereinafter. Assembly 140 provides DC electric power to the storage device one or more motor coach DC loads 74 with circuitry 150 and provides regulated AC electric power with inverter 146. AC electric loads are supplied via inverter AC output bus 180. Bus 180 is coupled to AC power transfer switch 182 of system 128. One or more coach AC electrical loads 184 are supplied via switch 182. System 128 also provides inverter load distribution 186 from bus 180 without switch 182 intervening therebetween.

As shown in FIG. 8, switch 182 is electrically coupled to external AC electrical power source 190 (shore power). It should be appreciated that shore power generally cannot be used when vehicle 120 is in motion, may not be available in some locations; and even if available, shore power is typically limited by a circuit breaker or fuse. When power from source 190 is applied, genset 130 is usually not active. Transfer switch 182 routes the shore power to service loads 184, and those supplied by inverter load distribution 186. With the supply of external AC power from source 190, assembly 140 selectively functions as one of loads 184, converting the AC shore power to a form suitable to charge storage device 170. In the following description, AC shore power should be understood to be absent unless expressly indicated to the contrary.

Assembly 140 further includes processor 200. Processor 200 executes operating logic that defines various control, management, and/or regulation functions. This operating logic may be in the form of dedicated hardware, such as a hardwired state machine, programming instructions, and/or a different form as would occur to those skilled in the art. Processor 200 may be provided as a single component, or a collection of operatively coupled components; and may be comprised of digital circuitry, analog circuitry, or a hybrid combination of both of these types. When of a multi-component form, processor 200 may have one or more components remotely located relative to the others. Processor 200 can include multiple processing units arranged to operate independently, in a pipeline processing arrangement, in a parallel processing arrangement, and/or such different arrangement as would occur to those skilled in the art. In one embodiment, processor 200 is a programmable microprocessing device of a solid-state, integrated circuit type that includes one or more processing units and memory. Processor 200 can include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, and/or different circuitry or functional components as would occur to those skilled in the art to perform the desired communications.

Many other embodiments of the present application are envisioned. For example, one embodiment discloses an apparatus comprising electronic circuitry including a component structured to generate heat during operation; a heatsink structured to dissipate at least a portion of the heat generated by the component; a spring including a first end portion opposite a second end portion, and a retaining device including a cavity receiving the first end portion of the spring, the retaining device being positioned in an overlapping relationship with the component and fixed in relation to the heatsink to bias the spring and position the second end portion of the spring to clamp the component in a thermally coupled relationship with the heatsink.

One further example comprises: positioning a heat generating component on a portion of an upper surface of a heatsink; positioning a retaining device on a second portion of the heatsink to put a spring in the retaining device in contact with a surface of the heat generating component; and coupling the retaining device to the heatsink such that the spring forcibly presses the heat generating component against the heatsink.

Another embodiment of the present application discloses an apparatus comprising electronic circuitry including a component structured to generate heat during operation; a heatsink structured to dissipate at least a portion of the heat generated by the component; a coil spring; and a retaining device fixed in relation to the heatsink to hold the spring between the retaining device and the component in a compressed state to exert a force to maintain thermal coupling between the component and the heatsink.

Another aspect of the present application discloses a method of dissipating heat from an electronic component. The method includes means for positioning electronic circuitry including a component structured to generate heat during operation on a portion of a heatsink structured to dissipate at least a portion of the heat generated by the component; and means for positioning a retaining device in an overlapping relationship with the component and in fixed relation to the heatsink to bias a spring contained in the retaining device to clamp the component in a thermally coupled relationship with the heatsink.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow. In reading the claims it is intended that when words such as "a," "an," "at least one," "at least a portion" are used there is no intention to limit the claim to only one item unless specifically stated to the contrary in the claim. Further, when the language "at least a portion" and/or "a portion" is used the item may include a portion and/or the entire item unless specifically stated to the contrary. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by any of the following claims are desired to be protected.

What is claimed is:

1. An apparatus, comprising:
electronic circuitry including a component structured to generate heat during operation;
a heatsink structured to dissipate at least a portion of the heat generated by the component;

a spring including a first end portion opposite a second end portion; and a retaining device including a cavity receiving the first end portion of the spring, the retaining device being positioned in an overlapping relationship with the component and fixed in relation to the heatsink to bias the spring and position the second end portion of the spring to clamp the component in a thermally coupled relationship with the heatsink, wherein the cavity extends from an opening to an engagement seat opposite the opening, and the engagement seat is shaped and sized to engage the first end portion of the spring in a press-fit coupled relationship.

2. The apparatus of claim 1, wherein the retaining device includes a base portion and an offset base portion, wherein the cavity is defined in the offset base portion.

3. The apparatus of claim 2, wherein the spring is of a coil type and protrudes outwardly from the offset base portion.

4. The apparatus of claim 1, wherein the component is a semiconductor component and the heatsink includes a thermally conductive block thermally coupled to a plate defining a passageway structured to flow a cooling fluid therethrough.

5. The apparatus of claim 1, wherein the retaining device defines a plurality of other cavities each receiving a corresponding one of a number of other springs, the electronic circuitry includes a number of heat emitting semiconductors, and the other springs each apply a clamping force to a respective one of the semiconductors to maintain thermal coupling to the heatsink.

6. The apparatus of claim 1, further comprising means for fixing the retaining device to the heatsink.

7. The apparatus of claim 1, wherein:
the retaining device is a unitary piece of metal and a thermally conductive adhesive layer is positioned between the component and the heatsink, and the thermally conductive adhesive layer is in contact with each of the component and the heatsink.

8. A method, comprising:
positioning electronic circuitry including a component structured to generate heat during operation on a portion of a heatsink structured to dissipate at least a portion of the heat generated by the component;

providing a spring comprising a first end portion opposite a second end portion;

providing a retaining device comprising a cavity that extends from an opening to an engagement seat opposite the opening;

connecting the first end portion of the spring in the engagement seat of the retaining device with the second end portion protruding from the opening in an uncompressed state; and after the connecting of the first end portion of the spring, positioning the retaining device in an overlapping relationship with the component and in fixed relation to the heatsink to bias the spring to clamp the component in a thermally coupled relationship with the heatsink.

9. The method of claim 8, further comprising:
connecting the heatsink to a cold plate; and
circulating a cooling fluid through the cold plate.

10. The method of claim 9, which includes providing the electronic circuitry in power generation system for a vehicle.

11. The method of claim 9, wherein the retaining device is coupled to the heatsink using a stud and a nut.

12. The method of claim 8, further comprising positioning a thermally-conductive and electrical insulating material between the heatsink and the component, the material being in contact with the heatsink and the component.

13. The method of claim 8, wherein the connecting of the first end portion includes fixing the first end portion in the engagement seat in a press-fit coupled relationship.

14. An apparatus, comprising:
electronic circuitry including a component structured to generate heat during operation;

a heatsink structured to dissipate at least a portion of the heat generated by the component;

a coil spring including a first end portion; and a retaining device including a cavity receiving the first end portion of the spring, fixed in relation to the heatsink, to hold the spring between the retaining device and the component in a compressed state to exert a force to maintain thermal coupling between the component and the heatsink, and wherein the cavity extends from an opening to an engagement seat opposite the opening, and the engagement seat is shaped and sized to engage the first end portion of the spring in a fixed relationship.

15. The apparatus of claim 14, wherein the retaining device includes a base portion and an offset base portion, and wherein the cavity is located in the offset base portion.

16. The apparatus of claim 15, wherein the spring is seated in an upwardly facing cavity in the lower surface of the retaining device.

17. The apparatus of claim 14, further comprising a cold plate engaged with a lower surface of the heatsink and wherein the cold plate includes a tubing inside the cold plate to convey a cooling fluid.

18. The apparatus of claim 17, further comprising a vehicle carrying a power generation system, the electronic circuitry being included in the power generation system.

19. The apparatus of claim 14, further comprising a stud positioned in apertures in the heatsink and the retaining device, wherein a nut is placed on an end of the stud to maintain the spring in forcible engagement with the component.

20. The apparatus of claim 14, further comprising a thermally-conductive and electrically insulating material between the heatsink and the component.

* * * * *